United States Patent
Orcutt

[11] Patent Number: 5,735,030
[45] Date of Patent: Apr. 7, 1998

[54] LOW LOOP WIRE BONDING

[75] Inventor: John W. Orcutt, Richardson, Tex.

[73] Assignee: Texas Instruments Incorporated, Dallas, Tex.

[21] Appl. No.: 657,570

[22] Filed: Jun. 4, 1996

[51] Int. Cl.[6] .................................................. H01R 43/00
[52] U.S. Cl. ............................. 29/86; 29/827; 29/843; 174/52.4; 257/686; 437/217
[58] Field of Search ........................... 29/827, 843, 860, 29/575; 437/217, 219, 220, 209–211; 174/52.4; 257/686, 676, 782

[56] References Cited

U.S. PATENT DOCUMENTS

| | | | |
|---|---|---|---|
| 5,025,114 | 6/1991 | Braden | 174/52.4 |
| 5,056,217 | 10/1991 | Yamazaki et al. | 29/860 |
| 5,229,329 | 7/1993 | Chai et al. | 437/217 |
| 5,249,354 | 10/1993 | Richman | 29/827 |
| 5,291,061 | 3/1994 | Ball | 257/686 |
| 5,441,429 | 8/1995 | Seibler | 29/843 |

*Primary Examiner*—W. Donald Bray
*Attorney, Agent, or Firm*—Wade James Brady, III; Richard L. Donaldson

[57] ABSTRACT

A method of making a wire connection in a microelectronic device, preferably a semiconductor device, which includes providing a microelectronic device (7) having a bond pad (5) thereon and a wire bonding location (9) external to the microelectronic device, such as the lead finger of a lead frame. A wire (1) is provided for connection to the lead finger and the bond pad (5) to which a ball (21) has first been bonded. The ball (21) is preferably of gold and is of a material electrically compatible with the material of the wire on the bond pad. One end of the wire is connected to the lead finger (9) by a ball bond (23) and then the other end of the wire is connected to the ball (21) to complete the connection and provide a connection without a loop over the bond pad.

16 Claims, 1 Drawing Sheet

LOW LOOP WIRE BONDING

BACKGROUND OF THE INVENTION

1. Field of the Invention

This invention relates to bonding of wire between two bonding locations and, more specifically to bonding of wire between a bond pad on a semiconductor chip or die and a second bonding location, such as a lead finger wherein the wire loop between bonding locations has a very low height on the order of about 0.002 inches.

2. Brief Description of the Prior Art

In view of the increasing miniaturization of semiconductor devices and the packaging therefor, a dimension of concern is not only the length and width of the package, but also the thickness of the final packaging. Prior art wire ball bonding techniques make the wire interconnection between the chip bond pad and the lead frame finger by making a ball bond to the chip bond pad, looping the wire to the lead finger, making a wire to lead finger stitch bond, and then making the wire pig tail to finish the wire interconnect. As the wire exits the ball bond on the chip bond pad, it turns toward the lead finger, making a loop, defining the loop height of the wire interconnect. The normal loop height is generally about 0.010 to 0.015 inches in height and accordingly resulted in package thickness to accommodate this height. As thinner packages have been developed, the loop height has been reduced with conventional bonding techniques down to about 0.006 inches in height by changes in the loop parameters, profile and wire types. However, this loop height is considered to be a minimum obtainable loop height as attempts to go lower have caused wire damage and poor wire pull strengths.

The loop height can be reduced to about 0.003 inches by the use of an entirely different wiring technique known as tab bonding. However, tab bonding is uneconomic due to the high cost of the materials required and the necessity to have custom film for each different die. The extra processing required in tab bonding also results in diminished yields.

It is therefore apparent that a relatively inexpensive wire bonding technique capable of achieving loop heights in the range of about 0.002 inches or even less is highly desirable.

SUMMARY OF THE INVENTION

In accordance with the present invention, there is provided a wire bonding method which meets the above described goals.

Briefly, the low wire bond height is made in two steps. First, a ball only bond is made on the bond pads of the chip. This is accomplished by making a ball bond on the bond pad in the standard manner and then initiating the pig tail operation at the ball bond, rather than the normal looping, lead finger stitch bond, and pig tail initiation sequence of operations used in ball wire bonding. In the second step, the normal bonding sequence is used except that the ball bond is made on the lead finger and the stitch bond is made on the ball previously bonded on the chip bond pad. The lead finger is typically lower in the package than the surface of the chip and this allows the loop of the wire coming from the lead finger to be basically parallel to the chip surface. The first ball bond is made large enough to allow the stitch bond of the second step and to maintain approximately 0.001 inch clearance between the wire and the surface of the chip. Adding the wire diameter to this clearance makes the total loop height about 0.002 inches.

It can be seen that the wire bond procedure in accordance with the present invention provides an essentially zero wire loop height above the ball bond and the surface of the chip and uses standard, economical, prior art bonding techniques and equipment.

DESCRIPTION OF THE PREFERRED EMBODIMENT

Figure 1:
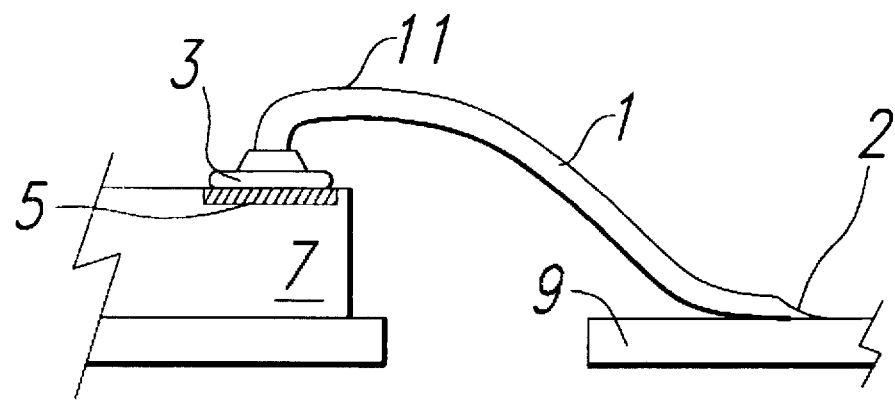
FIG. 1 is a schematic diagram of a wire connection from a bond pad on a semiconductor die to a lead finger in accordance with the prior art.

Referring first to FIG. 1, there is shown a typical low loop wire connection in accordance with the prior art. Typically, the connection is provided by threading a wire 1 through a standard wire bonding capillary and heating the end of the wire to form a ball. The ball 3 is applied to a bond pad 5 on a chip or die 7 and bonded to the bond pad. The capillary is then moved to a lead finger 9 with the wire 1 being threaded through the capillary until the wire has reached the lead finger. The wire 1 is then stitch bonded thereto at stitch bond 2. In making the connection, it is necessary to loop the wire 1 above the bond pad 5 at the neck 11 in order to minimize the likelihood of damage to the wire, such as cracking. This necessity to loop the wire 1 requires that the wire stand at least 0.006 inches and generally an even greater distance above the bond pad and thereby adds to the required thickness of the ulitmate packaging.

Figure 2:
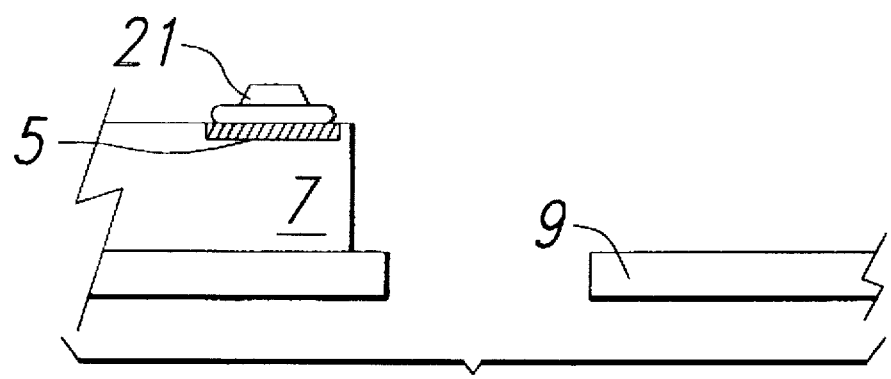
FIGS. 2 and 3 are a process flow for providing a wire connection for a lead finger to a bond pad on a semiconductor die in accordance with the present invention.
Figure 3:
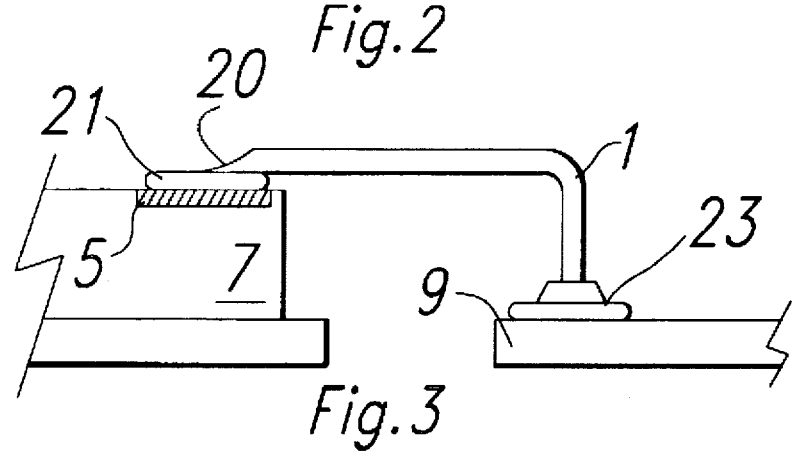

Referring now to FIGS. 2 and 3, there is shown a process flow for wire bonding in accordance with the present invention. In FIG. 2, there is shown a chip or die 7 having a bond pad 5 thereon and a lead finger 9 as in the prior art. Initially, a ball 21 is formed in standard manner and bonded to the bond pad 5. A ball only is made by initiating the pig tail operation after the ball bond which also prepares the wire for the next ball bond. The capillary (not shown) with wire 1 therein then moves over the lead finger 9 and a ball is then formed from the wire protruding from the capillary in standard manner and the ball 23 is then bonded to the lead finger 9 in standard manner. The capillary then moves over the ball 21 and threads the wire 1 therethrough to the ball 21 and positions the wire over the ball 21 and the wire 1 is then stitch bonded with stitch bond 20 to the ball 21 in standard manner. The capillary then pulls the wire 1 away from the stitch bond 20 at ball 21 in standard manner, establishing the next wire pig tail, ready for ball formation. As can be seen in FIG. 3, there is no loop required in the wire immediately over the ball 21 due to the order in which the bonds have been made and because the ball 21 had already been disposed on the bond pad 5 when the wire 1 was placed thereover for bonding. The neck required in the wire 1 from the lead finger to the bond pad 5 is generally, at most, the difference in height between the lead finger and the bond pad, since the bond pad is usually raised relative to the position of the lead finger. Also, the ball 21 on the die pad 3 provides clearance between the capillary and the die pad itself as well as setting the minimum height between the capillary and the die.

It follows that the wire bonding and connection process in accordance with the present invention provides the required bond in a relatively inexpensive manner and without the requirement of a loop or neck in the wire over the bond pad.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A method of making a wire connection in a microelectronic device comprising the steps of:
   (a) providing a microelectronic device having a bond pad thereon;
   (b) providing a lead finger spaced from said bond pad;
   (c) providing a wire for connection to said lead finger and said bond pad;
   (d) then providing a protuberance on said bond pad of a material electrically compatible with the material of said wire;
   (e) connecting one end of said wire to said lead finger; and
   (f) then connecting the other end of said wire to said protuberance.

2. The method of claim 1 wherein the connection to said lead finger is a ball bond and the connection to said protuberance is a stitch bond.

3. The method of claim 1 wherein said protuberance is gold and said wire is gold.

4. The method of claim 2 wherein said protuberance is gold and said wire is gold.

5. The method of claim 1 wherein said lead finger is a part of a lead frame.

6. The method of claim 2 wherein said lead finger is a part of a lead frame.

7. The method of claim 3 wherein said lead finger is a part of a lead frame.

8. The method of claim 4 wherein said lead finger is a part of a lead frame.

9. The method of claim 1 wherein said protuberance is a ball bond.

10. The method of claim 2 wherein said protuberance is a ball bond.

11. The method of claim 3 wherein said protuberance is a ball bond.

12. The method of claim 4 wherein said protuberance ms a ball bond.

13. The method of claim 5 wherein said protuberance is a ball bond.

14. The method of claim 6 wherein said protuberance is a ball bond.

15. The method of claim 7 wherein said protuberance is a ball bond.

16. The method of claim 8 wherein said protuberance is a ball bond.

* * * * *